United States Patent [19]
Day et al.

[11] Patent Number: 5,672,882
[45] Date of Patent: Sep. 30, 1997

[54] ION IMPLANTATION DEVICE WITH A CLOSED-LOOP PROCESS CHAMBER PRESSURE CONTROL SYSTEM

[75] Inventors: Dennis J. Day, Manchaca; Donald L. Friede, Austin, both of Tex.

[73] Assignee: Advanced Micro Devices, Inc., Sunnyvale, Calif.

[21] Appl. No.: 580,640

[22] Filed: Dec. 29, 1995

[51] Int. Cl.$^6$ .................................................. H01J 37/18
[52] U.S. Cl. ............................. 250/492.21; 250/441.11
[58] Field of Search .......................... 250/492.21, 441.11, 250/398, 492.2

[56] References Cited

U.S. PATENT DOCUMENTS

| | | | |
|---|---|---|---|
| 3,983,402 | 9/1976 | Arndt, Jr. et al. | 250/441.11 |
| 4,528,451 | 7/1985 | Petric et al. | 250/441.11 |
| 4,987,933 | 1/1991 | Mack | 250/492.21 |
| 5,093,579 | 3/1992 | Amemiya et al. | 250/441.11 |

*Primary Examiner*—Kiet T. Nguyen
*Attorney, Agent, or Firm*—Kevin L. Daffer; Conley, Rose & Tayon

[57] ABSTRACT

An ion implantation device is presented having a closed-loop pressure control system to reduce pressure fluctuations within a process chamber during ion implantation. A pressure probe extends through a wall of the process chamber or a wall of a beam chamber in gaseous communication with the process chamber. A vacuum measurement unit, coupled to the pressure probe, is configured to produce an electrical pressure signal corresponding to the pressure sensed by the pressure probe. An interface electronics unit coupled to the vacuum measurement unit converts the electrical pressure signal into an electrical control signal for a flow control valve. The flow control valve is coupled to receive the electrical control signal and is configured to control a flow of an inert gas from an inert gas source to a gas inlet port in a wall of the process chamber. The inert gas may comprise argon, nitrogen, or any other gas inert to a wafer fabrication process. Fluctuations in the pressure within the process chamber are reduced by additions of appropriate amounts of inert gas when the pressure sensed by the vacuum measurement unit drops below a predetermined pressure threshold value.

11 Claims, 8 Drawing Sheets

ION IMPLANTATION DEVICE WITH A CLOSED-LOOP PROCESS CHAMBER PRESSURE CONTROL SYSTEM

BACKGROUND OF THE INVENTION

1. Field of the Invention

This invention relates to equipment used to manufacture integrated circuits and more particularly to an ion implantation device having a closed-loop system for controlling pressure within a process chamber.

2. Description of the Relevant Art

The manufacture of integrated circuits involves a series of wafer fabrication operations. One wafer fabrication operation is the formation of doped regions (i.e., regions of n-type or p-type dopant atoms) within a surface of a silicon wafer. Dopant atoms are typically incorporated into surfaces of silicon wafers using two common doping processes: diffusion and ion implantation.

Ion implantation is a physical process in which dopant atoms are ionized, accelerated to a velocity high enough to penetrate the surface of a silicon wafer, focused into a narrow beam, and scanned as a beam across the surface of a silicon wafer. Dopant ions impacting the surface of the wafer enter the wafer and come to rest below the surface. Offering more control over the location and number of dopant ions placed within the surface of a silicon wafer, ion implantation is used in most doping operations involved in the manufacture of integrated circuits with submicron feature sizes. Diffusion doping, a chemical process, has largely been relegated to doping operations in which close control of dopant atom placement and dose level is not required.

Selective doping is required to produce high density integrated circuits. Selective doping involves the formation of distinct doped regions within surfaces of silicon wafers. Layers of many common materials employed in the manufacture of integrated circuits may be used to block the beam of dopant ions during ion implantation, preventing dopant ions from being introduced into the areas of the silicon wafer covered by a masking layer. Materials which may be used to form masking layers include photoresist, silicon dioxide, silicon nitride, and aluminum. Due to its many advantages over other materials, photoresist is commonly used to form ion implantation masking layers.

Ion implantation takes place within a process chamber. Successful ion implantation requires that air within the process chamber be evacuated prior to and during an ion implantation procedure. Positively-charged dopant ions may become electrically neutral by acquiring electrons during collisions with air molecules remaining within the process chamber. Neutral dopant atoms cannot be counted by automatic sensing equipment configured to count charged ionic particles. Carrying out an ion implantation procedure in a process chamber containing a large number of air molecules may thus result in the delivery of an incorrect dopant dose level.

Cryogenic vacuum pumps are used to evacuate process chambers of ion implantation devices prior to ion implantation, and typically continue to operate at full capacity during ion implantation. A cryogenic vacuum pump reduces the pressure within a sealed chamber by freezing molecules of gases present in the chamber to cold surfaces within the pump. Gas molecules frozen to the cold surfaces of the pump cannot contribute to the pressure within the chamber. Cryogenic vacuum pumps are used to evacuate process chambers because, unlike other types of vacuum pumps, cryogenic vacuum pumps do not produce contaminants. The rate at which a cryogenic vacuum pump is able to reduce the pressure within a sealed chamber decreases with pumping time. Pumping capacity also decreases with a buildup of gas molecules on the cold surfaces of the pump between periodic cleanings.

Cryogenic vacuum pumps used to evacuate process chambers of ion implantation devices typically have no feedback pressure control mechanisms. Once enabled, the cryogenic vacuum pumps are designed to operate at maximum capacity. In the interest of throughput, ion implantation is started when pressures within process chambers drop below a certain threshold (typically $1.0 \times 10^{-5}$ torr). As a result, pressures within the process chambers continue to decrease as ion implantation operations proceed. The rates at which the pressure levels within process chambers decrease depend upon the pumping capacities of the cryogenic vacuum pumps involved.

Mechanical scanning is one approach used to uniformly dope unmasked regions of a surface of a silicon wafer using a relatively narrow beam of dopant ions. The mechanical scanning approach involves holding the beam of dopant ions in a fixed position and moving the silicon wafer in relation to the ion beam as the beam strikes the wafer. In many ion implantation devices configured for batch processing, wafers readied for ion implantation are placed on wafer clamps arranged around the periphery of a circular wafer disk. Following loading, the wafer disk is positioned within the process chamber. A beam of dopant ions from an ion source travels through a beam chamber, coupled to the processing chamber, before entering the process chamber.

The beam and process chambers are in gaseous communication, and are typically evacuated as a unit by one or more cryogenic vacuum pumps prior to and during ion implantation. One or more positioners affect mechanical scanning of the wafers by moving the wafers in relation to the stationary ion beam. Seals are required between moving and stationary parts of the ion implantation device which separate the evacuated beam and process chambers from the outside air. Such seals are not perfect, however, and small amounts of air leak past them as parts of the ion implantation device move relative to one another during scanning. These small amounts of air leaking past the seals and into the coupled beam and process chambers cause fluctuations in the pressure levels within the beam and process chambers.

A major source of pressure variations within the process chamber is outgassing of solvents within photoresist masking layers during ion implantation. As the ion beam strikes a photoresist masking layer, solvents remaining within the photoresist masking layer are released into the process chamber. As a result, the pressure within the process chamber increases until the released solvents are removed by the vacuum pumps. Pressure variations thus occur within the process chamber and the coupled beam chamber during scanning. The vacuum pumps, operating at full capacity, are not able to quickly remove the outgassed solvents (i.e., quickly reduce the magnitudes of the resultant pressure variations). As the photoresist masking layer is purged of solvents toward the end of processing, however, the amounts of solvents released during scanning decrease. As the amounts of solvents released decrease, the magnitudes of resultant pressure variations also decrease.

As determined by experimentation, doping silicon wafers with relatively low doses of dopant ions is highly dependent upon the pressure within the process chamber. Fluctuations in process chamber pressure levels, caused by photoresist solvent outgassing, air leaking past seals, and varying pumping capacities of cryogenic vacuum pumps, may thus significantly affect final dopant dose levels achieved. It would thus be desirable to have the ability to more closely control the pressure within the process chamber of an ion implantation device in order to more closely control final dopant dose levels achieved during ion implantation.

SUMMARY OF THE INVENTION

The problems outlined above are in large part solved by an ion implantation device having a closed-loop control system to reduce pressure fluctuations within a process chamber during an ion implantation procedure. In an ion implantation device of the present invention, a silicon wafer is implanted with dopant ions within an evacuated process chamber. The closed-loop process chamber pressure control system includes a flow control device which receives a pressure signal from within the process chamber, or from within a beam chamber coupled to and in gaseous communication with the process chamber. The flow control device is coupled between an inert gas source and a gas inlet port, extending through a wall of the process chamber, and controls a flow of inert gas from the inert gas source to the gas inlet port. The addition of inert gas molecules into the process chamber increases the pressure within the process chamber in response to the pressure signal. Fluctuations in the pressure within the process chamber are reduced by additions of appropriate amounts of the inert gas when the pressure within the process chamber drops below a predetermined pressure threshold value. As a result, the pressure level within the process chamber is held substantially constant during ion implantation. Pressure control by inert gas introduction is used as cryogenic vacuum pumps are not easily controlled, and process pressures greater than those currently maintainable with cryogenic vacuum pumps operating at full capacity are acceptable.

In a first embodiment, a pressure probe (i.e., a gas conduit) extending through a wall of the beam chamber is coupled to a receptor port of a vacuum measurement unit. The vacuum measurement unit is configured to produce an electrical pressure signal corresponding to the pressure sensed at the receptor port (i.e., the pressure within the beam chamber). An interface electronics unit coupled to the vacuum measurement unit converts the electrical pressure signal into an electrical control signal. A flow control valve is coupled to receive the electrical control signal and is configured to control a flow of an inert gas from an inert gas source to a gas inlet port extending through a wall of the process chamber. The inert gas may comprise argon, nitrogen, or any other inert gas. In a second embodiment, the pressure probe extends through a wall of the process chamber.

BRIEF DESCRIPTION OF THE DRAWINGS

Other objects and advantages of the invention will become apparent upon reading the following detailed description and upon reference to the accompanying drawings in which.

Figure 1A:
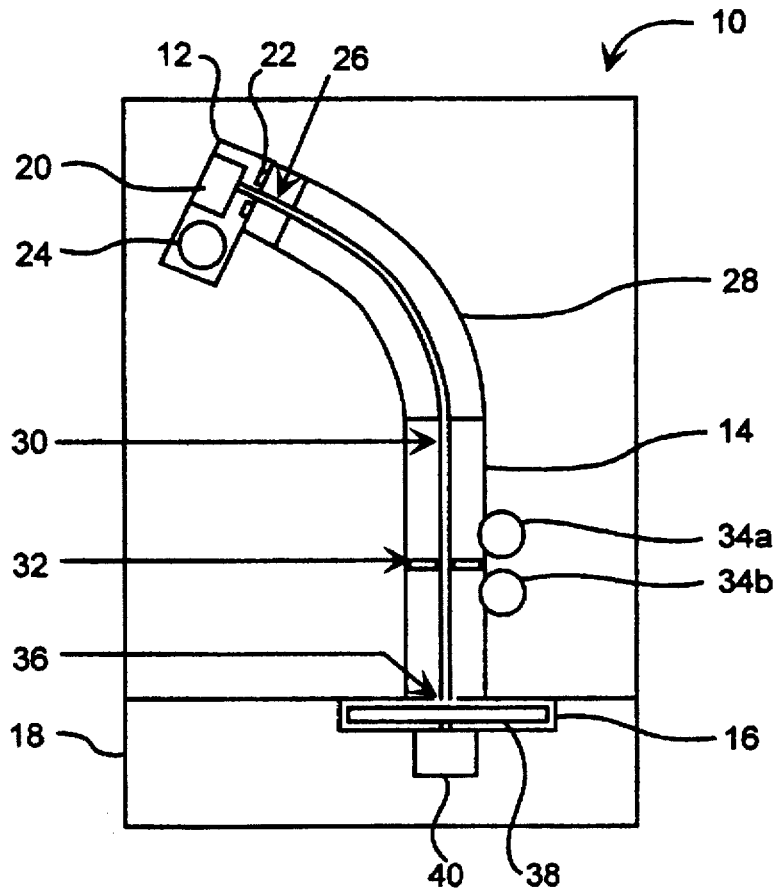
FIG. 1a is a top plan view of an ion implantation device.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1B:
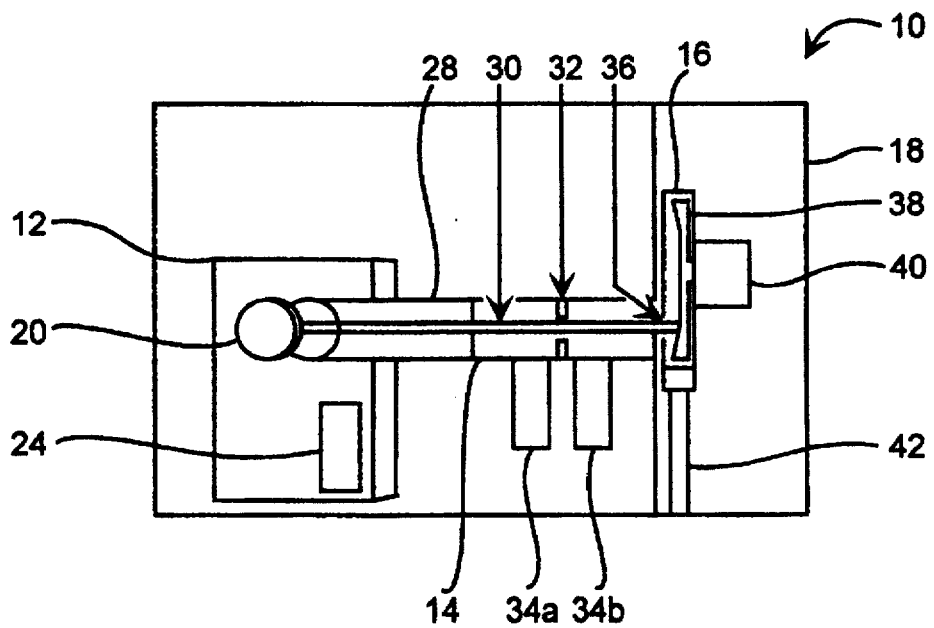
FIG. 1b is a side elevation view of the ion implantation device.

FIGS. 1a and 1b will be used to explain the operation of a representative ion implantation device. FIG. 1a is a top plan view of the ion implantation device, and FIG. 1b is a side elevation view of the device. Ion implantation device 10 includes an ion source chamber 12, a beam chamber 14, a process chamber 16, and an end section 18. Ion source chamber 12 includes an ion source 20, an ion source extraction electrode 22, and an ion chamber vacuum pump 24. Ion source 20 typically ionizes a feed gas containing atoms of a dopant element. Common dopant elements include boron, phosphorus, and arsenic. Positively-charged dopant ions are formed within ion source 20 through collisions between dopant feed gas molecules and energetic electrons from an arc discharge. The dopant ions are accelerated, by electrical repulsion from the positively-charged ion source chamber 20 and electrical attraction toward a negatively charged ion source extraction electrode 22, to a velocity corresponding to a desired penetration depth into a target silicon wafer at the opposite end of ion implantation device 10. Ions formed in ion source 20 exit ion source chamber 12 as an ion beam 26. Ion chamber vacuum pump 24 is used to evacuate ion chamber 12 prior to and during an ion implantation procedure. Ion chamber vacuum pump 24 is typically a diffusion or turbomolecular pump which is not easily saturated by the ion source feed gas flow.

Beam chamber 14 includes ion source chamber 12, an analyzing magnet 28, a pressure isolation aperture 32, and two beam chamber vacuum pumps 34a and 34b. Analyzing magnet 28 filters all but a single ionic species of interest (i.e., dopant ions) from ion beam 26 to form a dopant ion beam 30. A magnetic field created within analyzing magnet 28 causes each ion in incident ion beam 26 to follow an arcing trajectory while traveling through analyzing magnet 28. The radius of the trajectory of a given ion depends upon the mass and velocity of the ion, along with the strength of the magnetic field within analyzing magnet 28. A mechanical abstraction within analyzing magnet 28 blocks all ions with trajectories which do not have the proper curvature to pass through the exit end of analyzing magnet 28. Thus only the desired dopant ions exit analyzing magnet 28, forming dopant ion beam 30.

Beam chamber vacuum pumps 34a and 34b are cryogenic vacuum pumps used to evacuate air molecules from beam chamber 14 and process chamber 16 prior to and during an ion implantation procedure. Beam chamber vacuum pump 34a is positioned in a section of beam chamber 14 adjoining the exit end of analyzing magnet 28, and beam chamber vacuum pump 34b is positioned in a section of beam chamber 14 adjoining process chamber 16. Pressure isolation aperture 32, located between beam chamber vacuum pumps 34a and 34b, is used to reduce the degree of gaseous communication between the two sections of beam chamber 14 on either side of pressure isolation aperture 32. Pressure isolation aperture 32 helps keeps gas molecules, introduced into process chamber 16 and the adjoining section of beam chamber 14 during ion implantation, from entering the section of beam chamber 14 adjoining the exit end of analyzing magnet 28.

Prior to an ion implantation procedure, silicon wafers are placed in wafer clamps arranged around the periphery of a circular wafer disk 38. Wafer disk 38 is then positioned within process chamber 16, and beam chamber 14 and process chamber 16 are coupled together as shown in FIGS. 1a and 1b. An aperture 36 allows gaseous communication between beam chamber 14 and process chamber 16, and also allows dopant ion beam 30 to enter process chamber 16 from beam chamber 14. Beam chamber 14 and process chamber 16 are evacuated simultaneously by beam chamber vacuum pumps 34a and 34b.

During an ion implantation procedure, dopant ion beam 30 is formed in beam chamber 14 and enters process chamber 16 through aperture 36. Aperture 36 also allows gaseous communication between process chamber 16 and beam chamber 14. A rotary wafer disk positioner 40 and a process chamber positioner 42 are used to affect mechanical scanning of dopant ion beam 30 across the exposed surfaces of the silicon wafers by moving the wafers in relation to stationary dopant ion beam 30. Rotary wafer disk positioner 40 rotates wafer disk 38 at a constant speed about an axis through the center of wafer disk 38. Process chamber positioner 42 causes process chamber 16, coupled to wafer disk 38 and rotary wafer disk positioner 40, to move up and down vertically in relation to dopant ion beam 30. Using coordinated actions of rotary wafer disk positioner 40 and process chamber positioner 42, the exposed surfaces of the silicon wafers are mechanically scanned by dopant ion beam 30 until all wafers have been implanted.

Figure 1C:
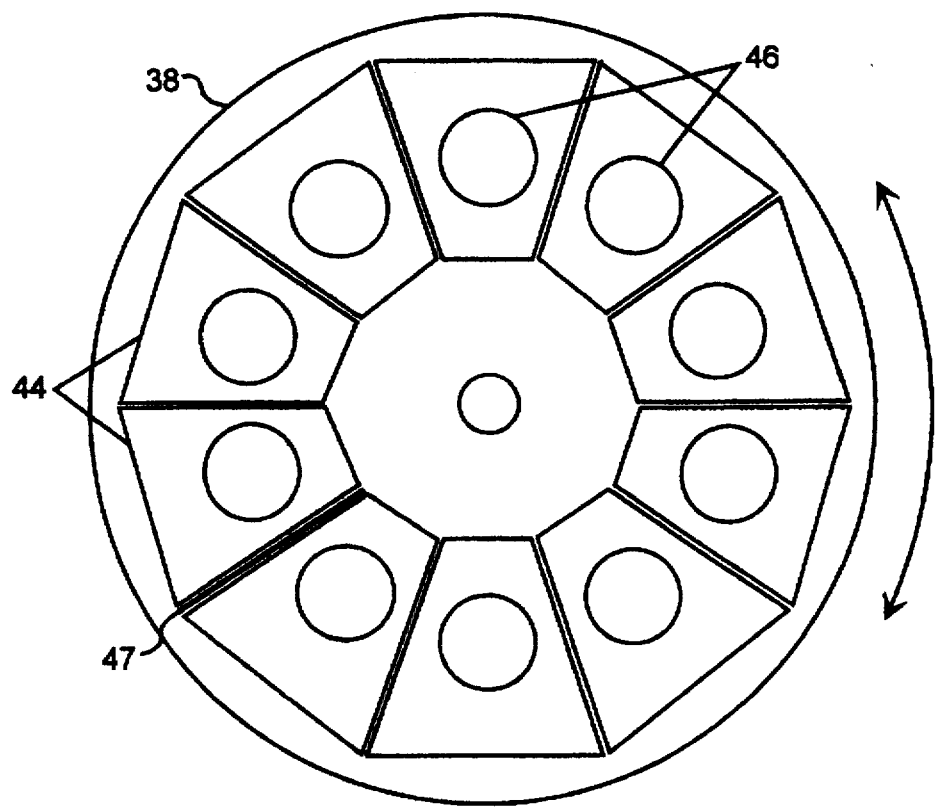
FIG. 1c is a front elevation view of a wafer disk with a plurality of semiconductor wafers arranged upon the wafer disk.

FIG. 1c is a front elevation view of wafer disk 38 of ion implantation device 10 as seen from beam chamber 14 during an ion implantation procedure. Wafer disk 38 includes, for example, ten wafer clamps 44 configured to hold ten silicon wafers 46 during an ion implantation procedure. Wafer clamps 44 are typically spring-loaded holding devices to secure the silicon wafers 46 against flat disk pads located on the outer surface of wafer disk 38. Wafer clamps 44 hold the silicon wafers 46 in place, and the disk pads provide support for the wafers during an ion implantation procedure. Wafer disk 38 also includes a Faraday slot 47 used to measure wafer dopant dose level.

Figure 1D:
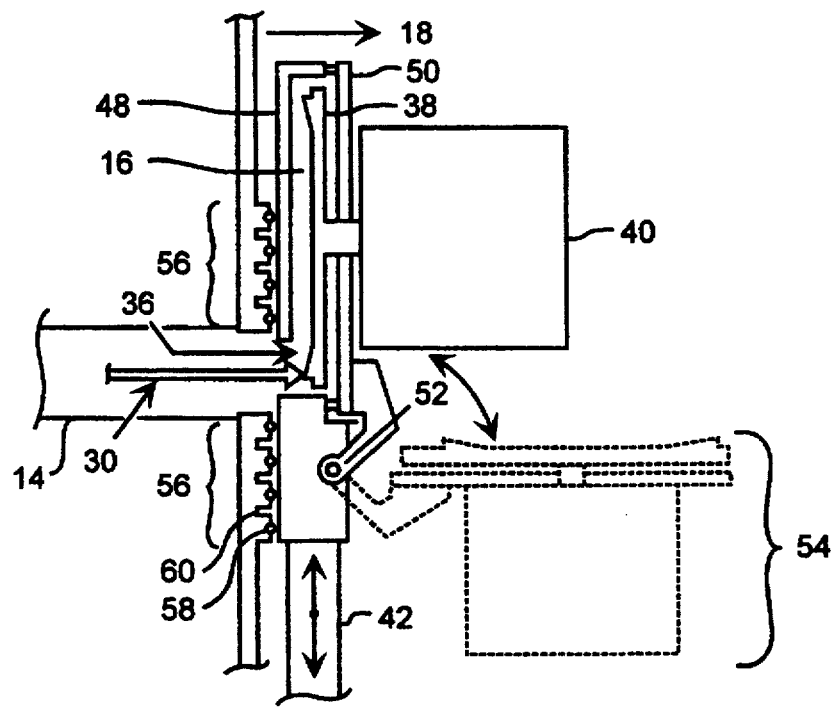
FIG. 1d is a cross-sectional view of a process chamber of the ion implantation device including the interfaces between the process chamber, a beam chamber, and an end section.

FIG. 1d is a cross-sectional view of process chamber 16 including the interfaces between process chamber 16, beam chamber 14, and end section 18. Process chamber 16 includes a process chamber base 48 and a process chamber cover 50. Ion implantation is carried out with process chamber cover 50 in a raised position as shown. Wafer disk 38 is mounted on one side of process chamber cover 50, and rotary wafer disk positioner 40 is coupled to process chamber cover 50 on the opposite side. A process chamber cover hinge 52 couples process chamber cover 50 to process chamber base 48, and allows loading and unloading of wafer clamps 44 on wafer disk 38 when process cover 50 is moved about the hinge 52 reciprocating axis to a lowered position 54. Process chamber positioner 42 is coupled to process chamber base 48.

A sliding seal 56 is employed at the sliding interface between beam chamber 14 and process chamber base 48 of process chamber 16. Sliding seal 56 includes, according to one embodiment, four concentric seal rings 58 separated by seal grooves 60. Each seal groove 60 is connected to a vacuum source (not shown) and evacuated individually to improve the effectiveness of sliding seal 56. During an ion implantation procedure, process chamber positioner 42 moves process chamber 16 vertically relative to beam chamber 14 in order to affect mechanical scanning of stationary dopant ion beam 30 over surfaces of silicon wafers 46 mounted on wafer disk 38. Sliding seal 56 is used to keep air at atmospheric pressure in end section 18 from entering evacuated process chamber 16 and beam chamber 14 through the sliding interface adjacent to aperture 36.

Figure 1E:
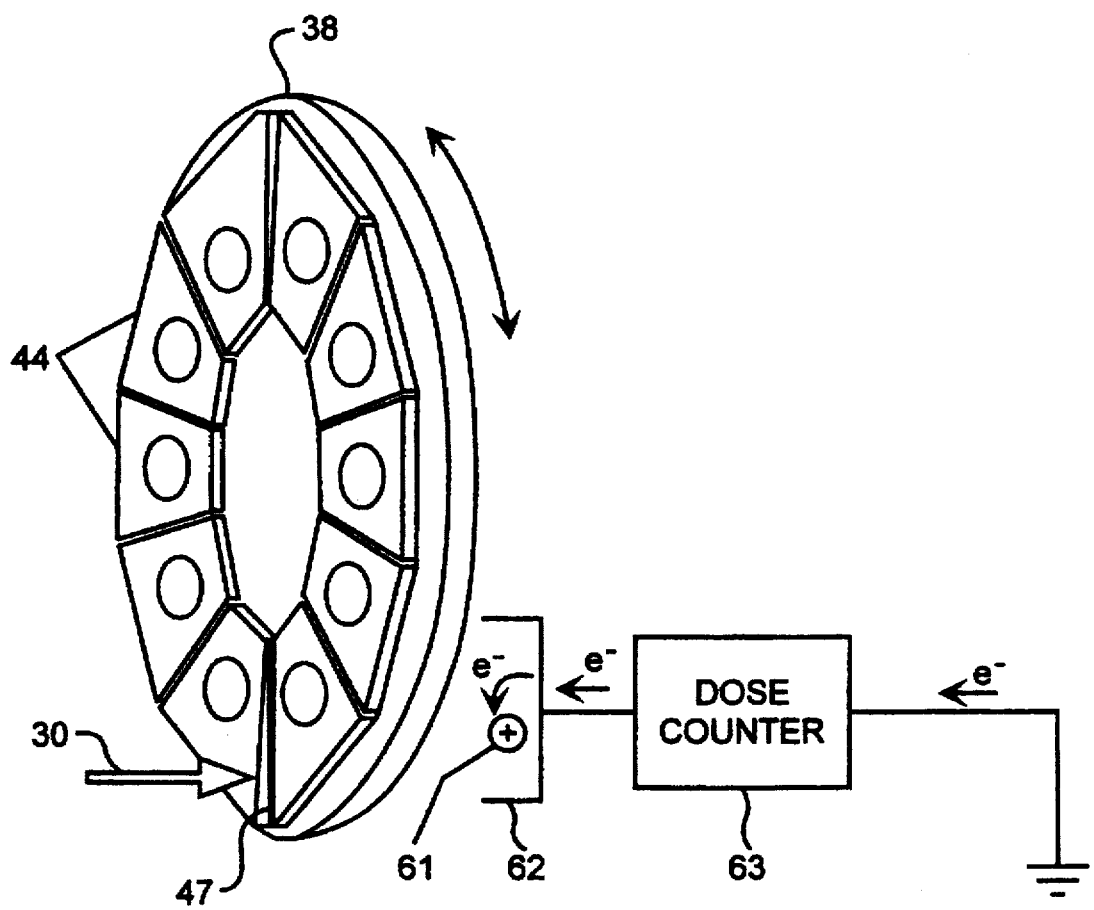
FIG. 1e is a block diagram of a dopant dose level measurement circuit of the ion implantation device.

FIG. 1e is a block diagram of a dopant dose level measurement circuit of an ion implantation device. The dopant dose level measurement circuit includes Faraday slot 47, a Faraday cage 62, and a dose counter 63. Faraday slot 47 is an opening in wafer disk 38, located between two wafer clamps 44 on wafer disk 38, which allows dopant ions in dopant ion beam 30 to pass through wafer disk 38 when Faraday slot 47 is aligned with dopant ion beam 30 during wafer scanning. Faraday cage 62 is located within process chamber 16 and positioned on the opposite side of wafer disk 38 from incident dopant ion beam 30 such that dopant ions passing through Faraday slot 47 strike Faraday cage 62. Faraday cage 62 is coupled to dose counter 63, and dose counter 63 is coupled to a grounded electrode.

When a positively-charged dopant ion 61 strikes Faraday cage 62, an electron is transferred from Faraday cage 62 to dopant ion 61. The electron neutralizes the positive electrical charge on dopant ion 61. The grounded electrode coupled to dose counter 63 functions as a source of electrons. As many dopant ions strike Faraday cage 62 and are neutralized during ion implantation, a flow of electrons is created between the grounded electrode and Faraday cage 62. This flow of electrons passes through dose counter 63, and is measured by dose counter 63. Dose counter 63 translates the electron flow measurement into a dopant dose level value.

As mentioned above, dopant ions may be neutralized by acquiring electrons during collisions with gas molecules within beam chamber 14. The pressure within beam chamber 14 is directly proportional to the number of gas molecules within beam chamber 14, and the number of dopant ions neutralized by collisions with air molecules is directly related to the number of gas molecules within beam chamber 14. Thus the number of dopant ions neutralized by collisions with gas molecules increases with increasing pressure within beam chamber 14. Resulting neutral dopant atoms retaining sufficient momentum-continue to travel down the beam chamber with the positively-charged dopant ions making up dopant ion beam 30. The neutral dopant atoms are also implanted within the surfaces of silicon wafers 46 along with the charged dopant ions. The neutral dopant atoms, however, cannot be counted by the dopant dose rate measurement circuit configured to count positively-charged ionic particles. As a result, the derived dopant dose level value is not correct.

An experiment was conducted to determine the relationship between process chamber pressure and resultant dopant dose levels achieved. Resultant dopant dose levels were witnessed by a change in monitor wafer sheet resistance values, with higher dopant dose levels associated with lower sheet resistance values. Sheet resistance values were measured using the common four-point probe method. A four-point probe consists of four thin metal probes arranged along a straight line. The probes are made to contact the surface of a wafer. In a typical sheet resistance measurement made using a four-point probe, a constant current is caused to flow between the two outer probes through the upper surface of the wafer. A resultant voltage drop is measured between the two inner probes. The sheet resistance of the thin layer near the surface of the silicon wafer is directly proportional to the ratio of the measured voltage drop to the applied current.

Three different sets of experimental tests were performed on two similar ion implantation devices (both models Nova NV-10, manufactured by the Eaton Corp., Beverly, MA). The ion implantation devices operate as described above. Each set of experimental tests involved implantation of four silicon wafers with phosphorus ions at target dose levels of $1.0 \times 10^{15}$ ions/cm$^2$. Process chamber pressure was measured at the inlet to a cryogenic vacuum pump located in a section of the beam chamber adjacent to the process chamber, the beam chamber in gaseous communication with the process chamber. Monitor wafer sheet resistance measurements were made following annealing and electrical activation. The first and second sets of experimental tests were carried out on a first ion implantation device, and the third set of experimental tests was executed on a second ion implantation device.

Figure 2:
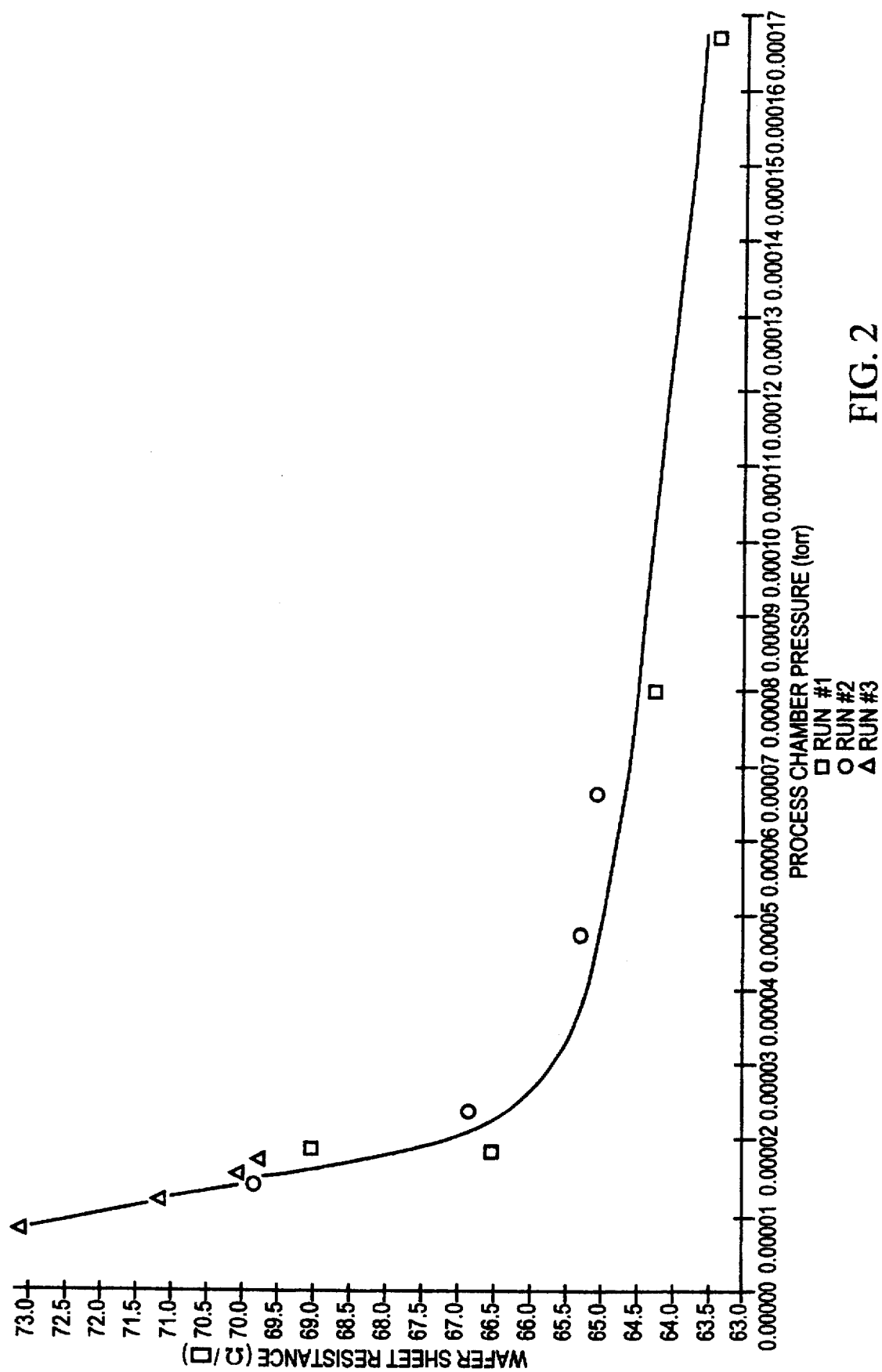
FIG. 2 is a graph of experimental results of monitor wafer sheet resistance versus process chamber pressure during ion implantation.

FIG. 2 is a graph of wafer sheet resistance versus process chamber pressure during ion implantation resulting from the above experiment. The graph demonstrates that doping silicon wafers with relatively low doses of dopant ions, on the order of $1.0 \times 10^{15}$ ion/cm$^2$, is highly dependent upon the pressure within the process chamber at process chamber pressure levels of $3.0 \times 10^{-5}$ torr and below. Typical ion implantation devices use pressure levels, for example, in the $1.0 \times 10^{-5}$ torr range.

Uniform doping of silicon wafers is accomplished by systematically scanning a relatively narrow dopant ion beam across the exposed surfaces of wafers on the wafer disk. Higher dopant dose levels require a larger number of wafer scans. On the ion implant device described above, the rotary wafer disk positioner rotates the wafer disk at a constant speed of about 950 revolutions per minute (RPM). During each wafer scan, the process chamber is moved from a highest vertical position to a lowest vertical position, then back up to a highest vertical position. Thus each wafer scan includes a downward vertical traverse of the process chamber followed by an upward vertical traverse of the process chamber. The entire exposed surface of each silicon wafer on the wafer disk is implanted with dopant ions during each vertical traverse of the process chamber. The vertical movements of the process chamber allow the dopant ion beam to follow arcing paths across the exposed surfaces of the wafers. At the highest and lowest vertical positions of the process chamber, the ion beam does not strike the exposed surfaces of the wafers.

Figure 3:
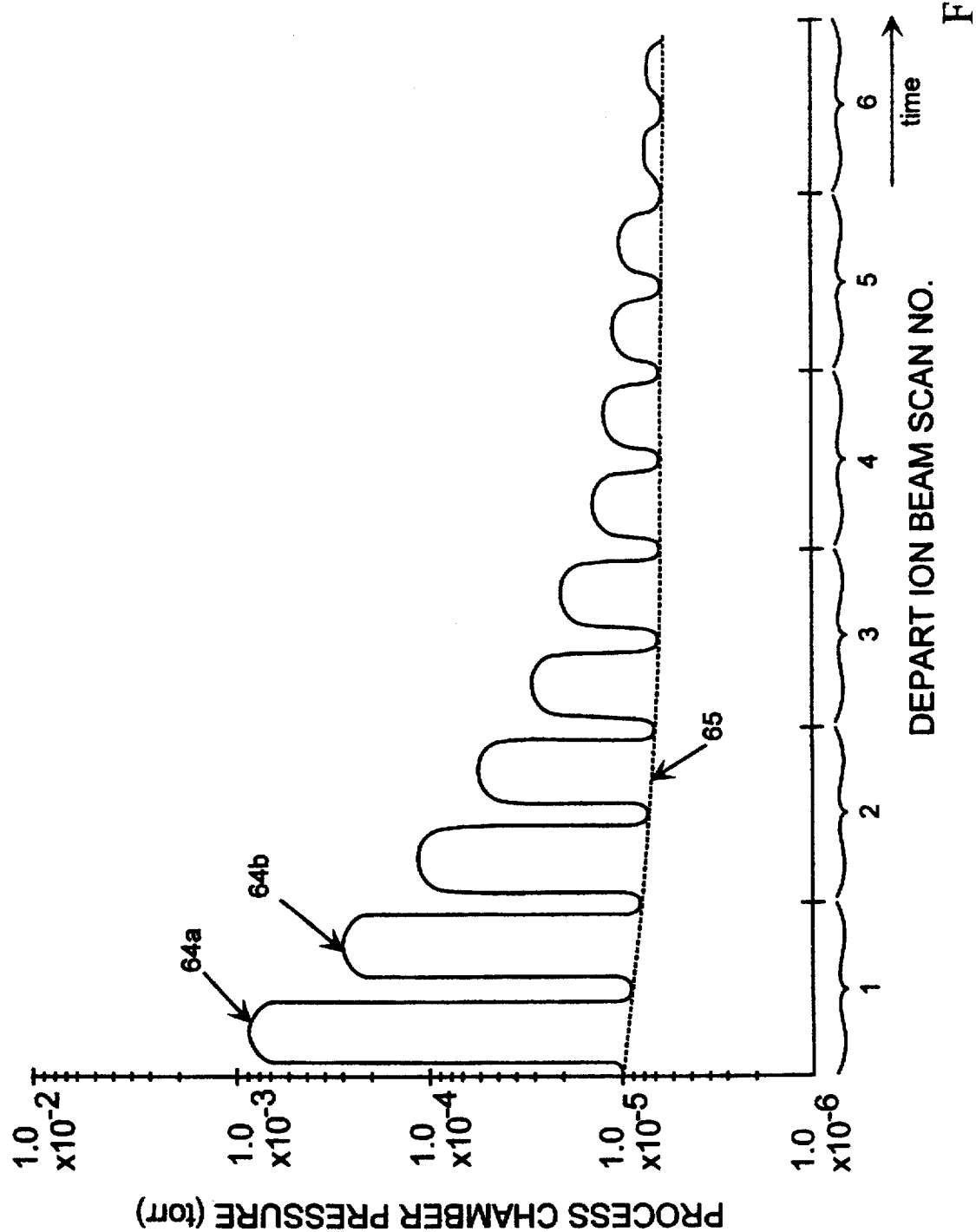
FIG. 3 is a logarithmic plot of process chamber pressure versus dopant ion beam scan number (i.e., time)

FIG. 3 is a composite logarithmic plot of experimental results involving process chamber pressure versus dopant ion beam scan number (i.e., time). Prior to each of several experimental runs, the frontside surfaces of 9 silicon wafers were coated with layers of photoresist. These 9 wafers simulated product wafers normally coated with patterned masking layers of photoresist. A bare monitor wafer was also included in each experimental run to facilitate post-implantation wafer sheet resistance measurements. During each experimental run, the frontside surfaces of 10 silicon wafers were subjected to a beam of phosphorus dopant ions during 6 consecutive wafer scans.

As evident in FIG. 3, sizable fluctuations in process chamber pressure levels occurred during ion implantation. Pressure peaks were largely caused by outgassing of solvents, remaining within the photoresist layers on 9 of the 10 wafers, during wafer scanning. Each wafer scan resulted in two consecutive pressure peaks, coinciding with the downward and subsequent upward vertical traverses of the process chamber. For example, pressure peak 64a occurred during the downward vertical traverse of the process chamber during the first half of the first wafer scan, and pressure peak 64b occurred during the upward vertical traverse of the process chamber during the second half of the first wafer scan. Process chamber pressure maxima occurred as the ion beam was scanned across the greatest exposed surface areas of the wafers. As the photoresist layers were purged of solvents toward the end of processing, the magnitudes of the resultant pressure variations decreased. Small amounts of air leaking past the sliding seal as the process chamber moved vertically during scanning also contributed to the magnitudes of pressure peaks 64a and 64b.

At the end of each vertical traverse of the process chamber, the ion beam does not strike the wafers, and outgassing of solvents from photoresist layers on exposed surfaces of the wafers ceases. At the same time, relative motion between the process and beam chambers also ceases, and the sliding seal allows only a very small amount of air to enter the process and beam chambers. As a result, the cryogenic vacuum pumps are able to remove most of the solvents and air molecules introduced into the process chamber during scanning. The vacuum level within the process and beam chambers recovers to a pressure base level 65 at the end of each vertical traverse of the process chamber. Pressure base level 65 shows a gradual decrease at a rate dependent upon the variable pumping capacities of the beam chamber vacuum pumps. The large fluctuations in beam and process chamber pressure evident in FIG. 3 significantly affect the final sheet resistance values achieved when silicon wafers are doped with relatively low doses of dopant ions (on the order of $1.0 \times 10^{15}$ ions/cm$_2$).

Figure 4:
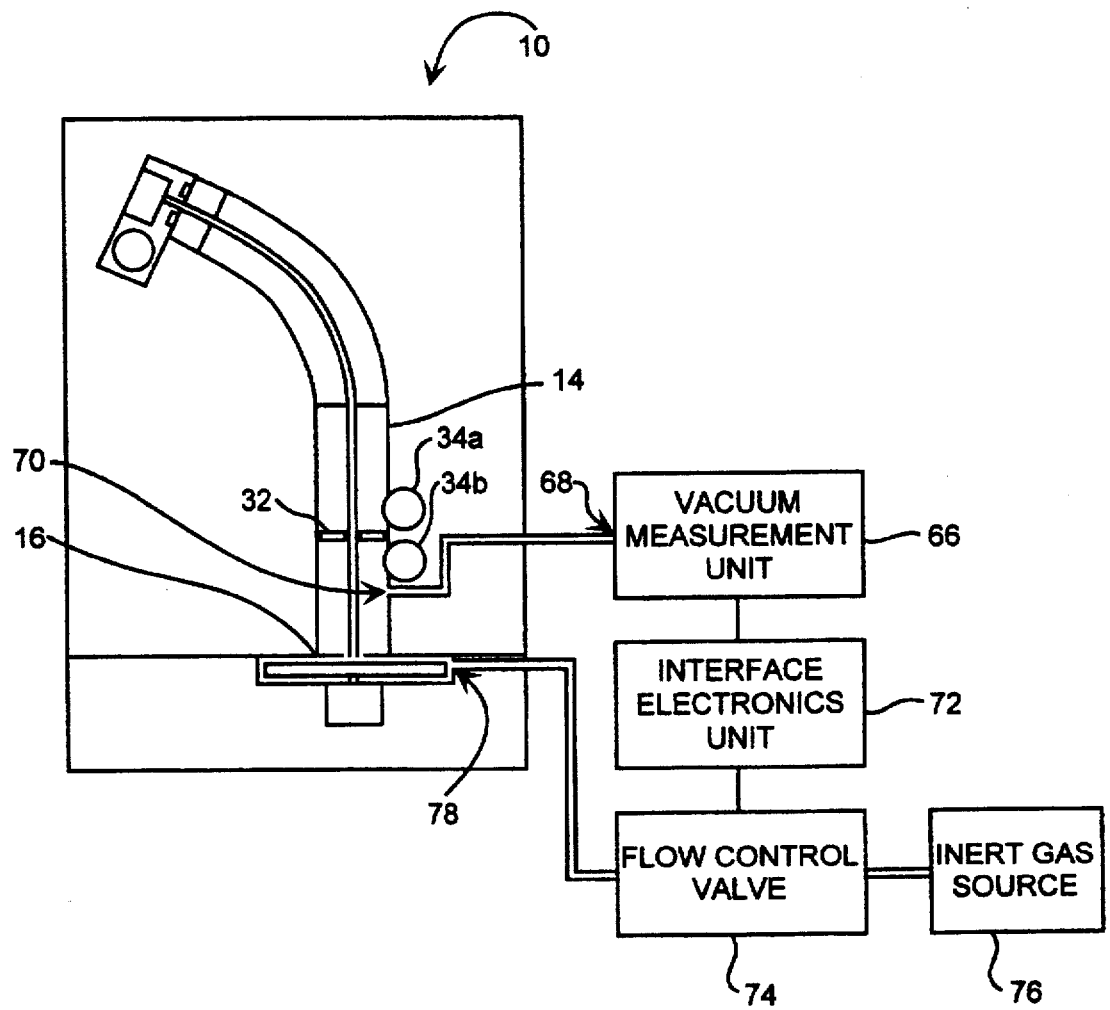
FIG. 4 is a top plan view of an ion implantation device including a closed-loop process chamber pressure control system in accordance with one exemplary embodiment of the present invention.

FIG. 4 is a top plan view of one embodiment of an ion implantation device 10 including a closed-loop process chamber pressure control system in accordance with the present invention. A vacuum measurement unit 66 has a receptor port 68 coupled to a pressure probe 70 located within beam chamber 14, beam chamber 14 in gaseous communication with process chamber 16. Pressure probe 70 is a gas conduit extending through a wall of beam chamber 14. An open sensing end of pressure probe 70 may be located in proximity to beam chamber pressure pump 34b as shown, or may be located anywhere within the section of beam chamber 14 between pressure isolation aperture 32 and process chamber 16. Vacuum measurement unit 66 produces an electrical pressure signal corresponding to the pressure at receptor port 68. With receptor port 68 coupled to pressure probe 70, vacuum measurement unit 66 thus senses the pressure within beam chamber 14 and produces a corresponding electrical pressure signal. Vacuum measurement unit 66 includes any device which can measure vacuum within a chamber, such as beam chamber 14, and translate the vacuum reading to an electrical signal corresponding to the pressure within the chamber. The electrical pressure signal produced may be a continuous analog signal or a digital signal updated periodically.

An interface electronics unit 72 is coupled to vacuum measurement unit 66, and receives the electrical pressure signal produced by vacuum measurement unit 66. Interface electronics unit 72 converts the electrical pressure signal received from vacuum measurement unit 66 into an electrical control signal for a flow control valve 74. When the pressure sensed by vacuum measurement unit 66 drops below a predetermined pressure threshold value, interface electronics unit 72 produces an electrical control signal which causes flow control valve 74 to allow an inert gas to be introduced into process chamber 16. The magnitude of the electrical control signal may be proportional to the difference between the pressure sensed by vacuum measurement unit 66 and the threshold value, and may also be proportional to the rate of change of the pressure sensed by vacuum measurement unit 66. The electrical control signal may be a continuous analog signal or a digital signal updated periodically.

Flow control valve 74 is coupled to interface electronics unit 72, an inert gas source 76, and a gas inlet port 78 extending through a wall of process chamber 16. Inert gas source 76 contains an inert gas at a pressure higher than the pressure within process chamber 16 during an ion implantation procedure. Flow control valve 74 receives the electrical control signal produced by interface electronics unit 72 and controls a flow of inert gas from inert gas source 76 to gas inlet port 78 in response to the electrical control signal. A suitable flow control valve includes any selectable gas valve which may be variably opened or closed in response to an electrical control signal, and which can deliver a variable amount of flow gas.

Fluctuations in the pressure within process chamber 16 are thus reduced by additions of appropriate amounts of inert gas to process chamber 16 when the pressure in beam chamber 14, in gaseous communication with process chamber 16, drops below a predetermined pressure threshold value. The pressure level within process chamber 16 is thus held substantially constant during ion implantation. Pressure control by inert gas introduction is preferred as cryogenic vacuum pumps are not easily controlled. Process pressures greater than those currently maintainable with cryogenic vacuum pumps operating at full capacity are acceptable, making process chamber pressure control via inert gas introduction feasible.

An inert gas is used to increase the pressure within the process chamber when necessary and without adversely impacting the ion implantation process or damaging any semiconductor structures which may exist on or in an exposed surface of a silicon wafer. An inert gas is thus a gas which does not adversely affect ion implantation or semiconductor device manufacture. The inert gas supplied by inert gas source 76 may comprise argon, nitrogen, or any other gas which is inert to a wafer fabrication process.

The amount of dopant ion neutralization is expected to increase with the introduction of inert gas molecules into the process chamber. However, the amount of neutralization will be held constant at a fixed pressure level. It is noted that a series of experiments would be necessary to determine the relationship between ion implantation device dopant dose level settings (controlled by automatic sensing equipment) and the actual dopant dose levels achieved (as witnessed by monitor wafer sheet resistance values). Once this relationship is known, dopant dose level settings may be adjusted accordingly in order to achieve a desired dopant dose level.

Figure 5:
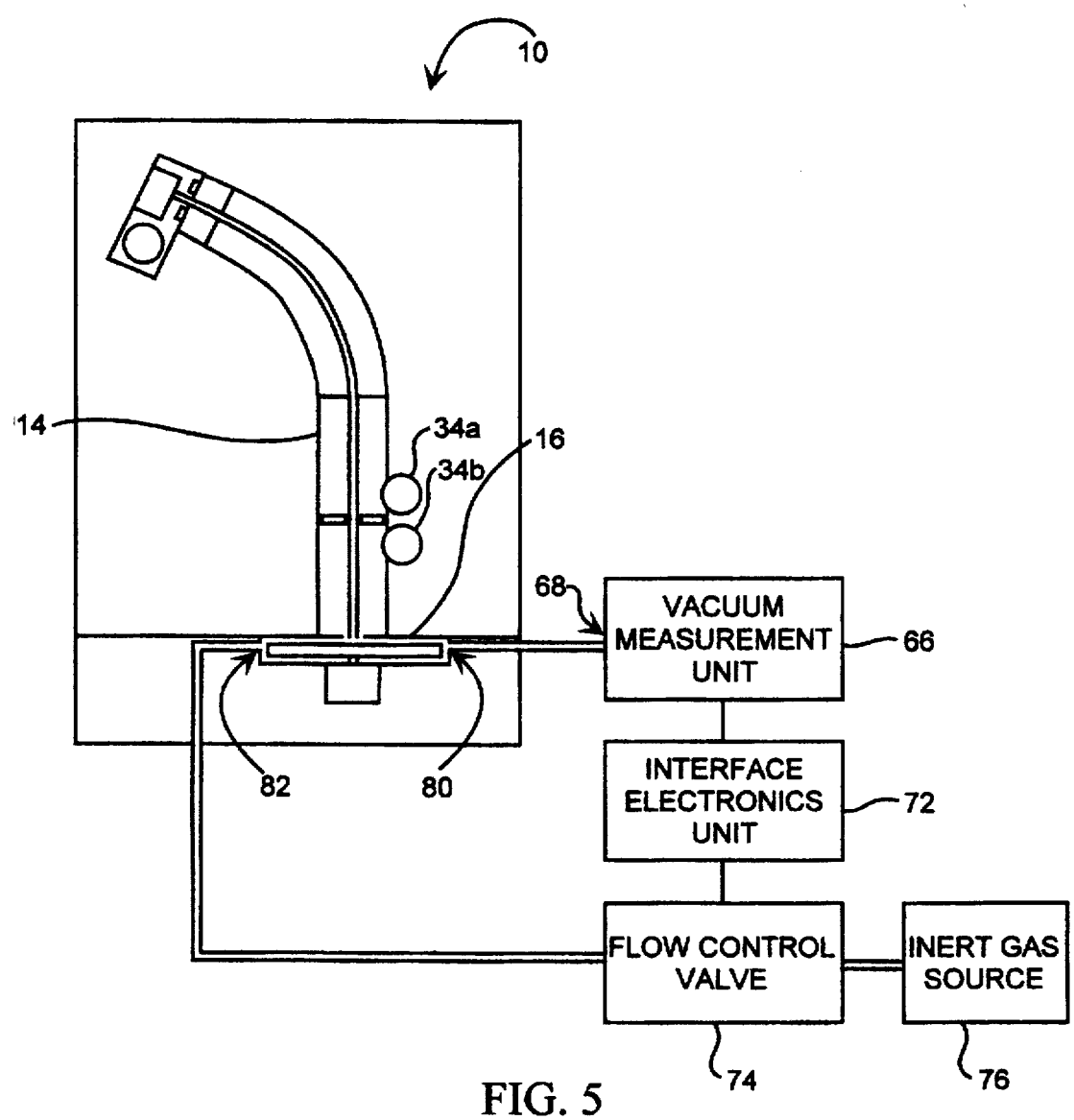
FIG. 5 is a top plan view of an ion implantation device including a closed-loop process chamber pressure control system in accordance with another exemplary embodiment of the present invention.

FIG. 5 is a plan view of a second embodiment of an ion implantation device 10 including a closed-loop process chamber pressure control system in accordance with the present invention. Receptor port 6 of vacuum measurement unit 66 is coupled to a pressure probe 80 extending through a wall of process chamber 16. Pressure probe 80 thus allows vacuum measurement unit 66 to sense the pressure within process chamber 16. Flow control valve 74 receives the electrical control signal produced by interface electronics unit 72 and controls the flow of inert gas from inert gas source 76 to a gas inlet port 82 extending through a wall of process chamber 16. Pressure sensing and corrective inert gas addition take place within the chamber where pressure control is desired, process chamber 16. In addition, pressure sensing and corrective gas addition take place in close proximity to the source of outgassing, the major source of pressure variations within process chamber 16. It is believed that this second embodiment may be capable of even tighter control of the pressure within process chamber 16 during an ion implantation procedure.

Figure 6:
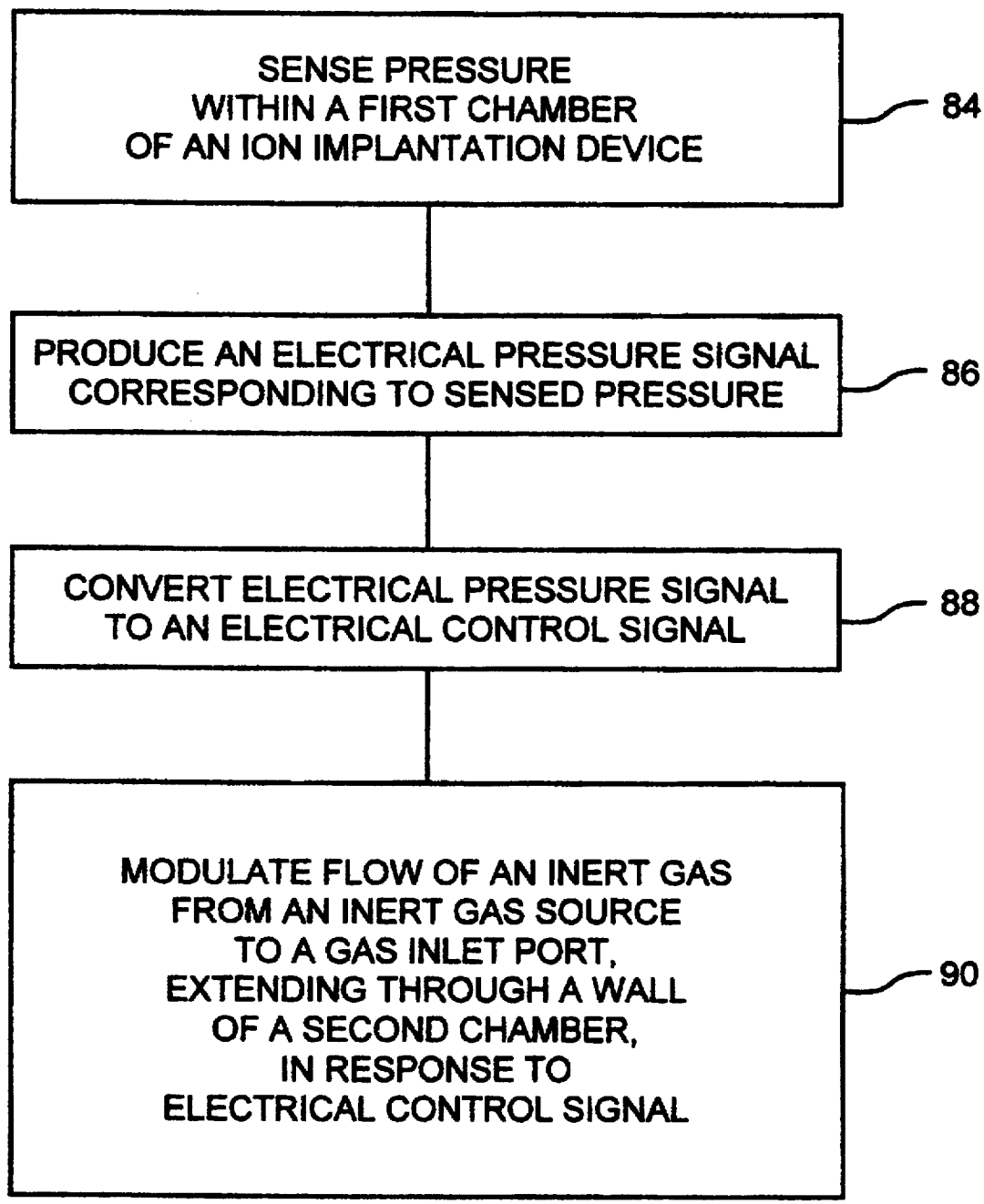
FIG. 6 is a flowchart of a method of controlling the pressure within a chamber of an ion implantation device in accordance with the present invention.

FIG. 6 is a flow chart of a method of controlling the pressure within a chamber of an ion implantation device in accordance with the present invention. A first step 84 includes sensing the pressure within a first chamber of an ion implantation device. In the embodiment of FIG. 4, the pressure is sensed within beam chamber 14. In the embodiment of FIG. 5, however, the pressure is sensed within process chamber 16. A step 86 includes producing an electrical pressure signal corresponding to the sensed pressure. In the embodiments of the apparatus described above, vacuum measurement unit 66 performs this function. The electrical pressure signal is then converted to an electrical control signal during a step 88. This conversion function is performed by interface electronics unit 72 in the above apparatus embodiments. During a subsequent step 90, a flow of an inert gas from an inert gas source to a gas inlet port, extending through a wall of a second chamber of the ion implantation device, is modulated in response to the electrical control signal. In the above apparatus embodiments, the gas inlet port extends through a wall of the process chamber, and flow control valve 74 modulates the flow of inert gas in response to the electrical control signal produced by interface electronics unit 72.

It will be appreciated to those skilled in the art having the benefit of this disclosure that this invention is believed to be an ion implantation device having a closed-loop pressure control system to control the pressure within a process chamber during an ion implantation procedure. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. An ion implantation device which reduces pressure fluctuations within a process chamber, comprising:

a process chamber configured to receive a semiconductor wafer;

a pressure probe comprising a gas conduit;

a vacuum measurement unit having a receptor port in gaseous communication with said pressure probe, wherein said measurement unit is operated to produce an electrical pressure signal corresponding to the gas pressure at said receptor port;

an interface electronics unit coupled to receive said electrical pressure signal and configured to convert said electrical pressure signal into an electrical control signal which is proportional to a pressure level at which an addition of an inert gas into said chamber is necessary to maintain a substantially constant gas pressure at said receptor port, during ion implantation and a flow control valve coupled between an inert gas source and a gas inlet port extending into said chamber, wherein the control valve receives said electrical control signal and during ion implantation, responsively introduces said inert gas into said chamber so as to maintain a substantially constant gas pressure at said receptor port at a predetermined pressure level.

2. The device as recited in claim 1, wherein said process chamber is evacuated prior to commencement of ion implantation.

3. The device as recited in claim 2, wherein said evacuation is achieved by using one ore more cryogenic vacuum pumps.

4. The device as recited in claim 3, wherein said one or more cryogenic vacuum pumps operate(s) at full capacity during ion implantation.

5. The device as recited in claim 1, wherein said pressure probe extends through a wail of said process chamber.

6. The device as recited in claim 1, further comprising a beam chamber within which a dopant ion beam is produced, wherein the beam chamber is in gaseous communication with said process chamber, and said pressure probe extends through a wall of said beam chamber.

7. The device as recited in claim 1, wherein said electronics unit converts said pressure signal by comparing said pressure signal to a predetermined threshold value and produces said control signal proportional to the difference between said pressure signal and said threshold value.

8. The device as recited in claim 7, wherein said flow control valve receives said control signal proportional to the difference between said pressure signal and said threshold value and responsively operates so as to maintain a substantially constant gas pressure at said receptor port at said predetermined pressure level corresponding to said threshold value.

9. The device as recited in claim 1, wherein said electronics unit converts said pressure signal by sensing the rate of change of said pressure signal and produces said electrical control signal proportional to said rate of change.

10. The device as recited in claim 9, wherein said flow control valve receives said control signal proportional to said rate of change and responsively operates so as to maintain a substantially constant gas pressure at said receptor port.

11. The ion implantation device as recited in claim 1, wherein the inert gas supplied by the inert gas source comprises argon.

* * * * *

UNITED STATES PATENT AND TRADEMARK OFFICE
CERTIFICATE OF CORRECTION

PATENT NO. : 5,672,882

DATED : September 30, 1997

INVENTOR(S) : Day et al.

It is certified that error appears in the above-identified patent and that said Letters Patent is hereby corrected as shown below:

Claim 3, col. 11, line 22, please replace the word "ore" with the word "or".

Claim 5, col. 11, line 28, please replace the word "wail" with the word "wall".

Signed and Sealed this

Tenth Day of February, 1998

Attest:

BRUCE LEHMAN

Attesting Officer

Commissioner of Patents and Trademarks